US009686891B2

United States Patent
Campbell et al.

(10) Patent No.: US 9,686,891 B2
(45) Date of Patent: Jun. 20, 2017

(54) THERMOELECTRIC-ENHANCED, INLET AIR COOLING FOR AN ELECTRONICS RACK

(71) Applicant: INTERNATIONAL BUSINESS MACHINES CORPORATION, Armonk, NY (US)

(72) Inventors: Levi A. Campbell, Poughkeepsie, NY (US); Milnes P. David, Fishkill, NY (US); Dustin W. Demetriou, Poughkeepsie, NY (US); Michael J. Ellsworth, Jr., Poughkeepsie, NY (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 41 days.

(21) Appl. No.: 14/791,681

(22) Filed: Jul. 6, 2015

(65) Prior Publication Data

US 2017/0013746 A1 Jan. 12, 2017

(51) Int. Cl.
*H05K 7/20* (2006.01)

(52) U.S. Cl.
CPC ..... *H05K 7/20781* (2013.01); *H05K 7/20736* (2013.01); *H05K 7/20836* (2013.01)

(58) Field of Classification Search
CPC ........... H05K 7/20781; H05K 7/20763; H05K 7/20627–7/20645

(Continued)

(56) References Cited

U.S. PATENT DOCUMENTS 6,557,354 B1 5/2003 Chu et al.
6,650,536 B2 11/2003 Lee et al.
(Continued)

FOREIGN PATENT DOCUMENTS

CN 102130076 B 5/2012
JP 2006-228868 A 8/2006
(Continued)

OTHER PUBLICATIONS

"Ferrotec Thermoelectric Modules—Peltier Cooler Model 9504/071/150 B", FerroTec website product page (1 page) (No additional date information available.).

(Continued)

*Primary Examiner* — Zachary M Pape
*Assistant Examiner* — Amir Jalali
(74) *Attorney, Agent, or Firm* — Steven Chiu, Esq.; Kevin P. Radigan, Esq.; Heslin Rothenberg Farley & Mesiti P.C.

(57) ABSTRACT

Thermoelectric-enhanced, rack-level cooling of airflow entering an electronics rack is provided by a cooling apparatus, which includes: an air-to-liquid heat exchanger; a coolant loop coupled to the heat exchanger, the coolant loop including a first loop portion and a second loop portion, where the heat exchanger exhausts heated coolant to the first loop portion and receives cooled coolant from the second loop portion. The cooling apparatus further includes a heat rejection unit and a thermoelectric heat pump(s). The heat rejection unit is coupled to the coolant loop between the first and second loop portions, and provides partially-cooled coolant to the second loop portion. The thermoelectric heat pump is disposed with the first and second loop portions coupled to opposite sides to transfer heat from the partially-cooled coolant within the second loop portion to provide the (Continued)

cooled coolant before entering the air-to-liquid heat exchanger.

17 Claims, 10 Drawing Sheets

(58) Field of Classification Search
USPC .......... 361/679.53, 699, 701; 165/80.4–80.5, 165/104.33
See application file for complete search history.

(56) References Cited

U.S. PATENT DOCUMENTS

| | | | |
|---|---|---|---|
| 6,819,563 B1 | 11/2004 | Chu et al. | |
| 7,212,403 B2 | 5/2007 | Rockenfeller | |
| 7,227,749 B2 | 6/2007 | Rockenfeller | |
| 7,235,406 B1 | 6/2007 | Woudenberg et al. | |
| 7,492,593 B2 | 2/2009 | Campbell et al. | |
| 7,688,584 B1 | 3/2010 | Beckin | |
| 7,950,244 B2 | 5/2011 | Iyengar et al. | |
| 8,248,801 B2 | 8/2012 | Campbell et al. | |
| 8,833,096 B2* | 9/2014 | Campbell | F25B 25/005 62/113 |
| 8,925,333 B2 | 1/2015 | Campbell et al. | |
| 8,955,347 B2 | 2/2015 | Campbell et al. | |
| 2002/0063327 A1 | 5/2002 | Chu et al. | |
| 2004/0025516 A1* | 2/2004 | Van Winkle | B60H 1/00478 62/3.3 |
| 2004/0100770 A1 | 5/2004 | Chu et al. | |
| 2005/0061013 A1 | 3/2005 | Bond | |
| 2006/0225441 A1* | 10/2006 | Goenka | B60H 1/00478 62/115 |
| 2006/0227504 A1 | 10/2006 | Chen et al. | |
| 2009/0225514 A1 | 9/2009 | Correa et al. | |
| 2012/0024501 A1* | 2/2012 | Campbell | H05K 7/2079 165/104.33 |
| 2012/0111027 A1* | 5/2012 | Campbell | F25B 21/02 62/3.3 |
| 2012/0111028 A1* | 5/2012 | Campbell | F25B 40/00 62/3.7 |
| 2012/0186790 A1 | 7/2012 | Delia et al. | |
| 2012/0201008 A1 | 8/2012 | Hershberger et al. | |
| 2012/0211204 A1 | 8/2012 | Agonafer et al. | |
| 2012/0247126 A1* | 10/2012 | Murase | B60H 1/00885 62/3.3 |
| 2012/0279233 A1 | 11/2012 | Chainer et al. | |
| 2013/0021746 A1* | 1/2013 | Campbell | H05K 7/20145 361/679.47 |
| 2013/0091867 A1* | 4/2013 | Campbell | H05K 7/20809 62/3.2 |
| 2013/0091868 A1 | 4/2013 | Campbell et al. | |
| 2014/0069111 A1* | 3/2014 | Campbell | B21D 53/02 62/3.2 |
| 2014/0133098 A1 | 5/2014 | Campbell et al. | |
| 2014/0165606 A1* | 6/2014 | Oh | F25B 21/02 62/3.3 |
| 2015/0059358 A1 | 3/2015 | Chang | |

FOREIGN PATENT DOCUMENTS

| | | |
|---|---|---|
| JP | 2013-258166 A | 12/2013 |
| KR | 10-2009-0024413 A | 3/2009 |
| KR | 10-0918315 B1 | 9/2009 |
| WO | WO2014131460 A | 9/2014 |

OTHER PUBLICATIONS

Campbell et al., "Thermoelectric-Enhanced, Inlet Air Cooling for an Electronics Rack", U.S. Appl. No. 14/870,297, filed Sep. 30, 2015 (39 pages).
Campbell et al., "Thermoelectric-Enhanced, Inlet Air-Cooled Thermal Conductors", U.S. Appl. No. 14/824,401, filed Aug. 12, 2015 (51 pages).
Campbell et al., "Thermoelectric-Enhanced, Inlet Air-Cooled Thermal Conductors", U.S. Appl. No. 14/922,324, filed Oct. 26, 2015 (44 pages).
Campbell et al., "List of IBM patents and/or Patent Applications Treated as Related", U.S. Appl. No. 14/791,681, filed Jul. 6, 2015, dated Mar. 16, 2016 (2 pages).
Marshall et al., "Modeling Alternative Cooling Concepts in CoolSim", White Paper No. 110, Applied Math Modeling Inc., Concord, NH (USA), Jul. 2011 (8 pages).
Moss, David L., "Top 10 Reasons to Consider Dell PowerEdge Energy Smart Containment Rack Enclosures", White Paper, Dell, Inc., Version 1.0, Apr. 2013 (11 pages).
Emerson Product Brochure, "Liebert DCD Rack Door Cooling Module—Chilled Water-Based, Fanless Rack Door Cooling Module", 2011 (No further date information is available) (2 pages).
Campbell et al., Notice of Allowance for U.S. Appl. No. 14/824,401, filed Aug. 12, 2015, dated Aug. 2, 2016 (10 pages).
Campbell et al., International Search Report and Written Opinion for PCT/GB1613446.2, dated Dec. 28, 2016, (4 pages).

\* cited by examiner

THERMOELECTRIC-ENHANCED, INLET AIR COOLING FOR AN ELECTRONICS RACK

BACKGROUND

The power dissipation of integrated circuit chips, and the modules containing the chips, continues to increase in order to achieve increases in processor performance. This trend poses a cooling challenge at both module and system levels. Increased airflow rates are needed to effectively cool high-power modules, and to limit the temperature of the air that is exhausted into the computer center.

In many large server applications, processors, along with their associated electronics (e.g., memory, disk drives, power supplies, etc.), are packaged in removable node or drawer configurations stacked within an electronics (or IT) rack or frame. In other cases, the electronics may be in fixed locations within the rack or frame. Typically, the components are cooled by air moving in parallel airflow paths, usually front-to-back, impelled by one or more air-moving devices (e.g., axial or centrifugal fans). In some cases, it may be possible to handle increased power dissipation within a single node by providing greater airflow through the use of a more powerful air-moving device, or by increasing the rotational speed (i.e., RPMs) of an existing air-moving device. However, this approach may be problematic at the rack-level dependent, in part, on the inlet air temperature.

BRIEF SUMMARY

In one or more aspects, the shortcomings of the prior art are overcome and additional advantages are provided through the provision of a cooling apparatus which comprises an air-to-liquid heat exchanger, a coolant loop, a heat rejection unit, and at least one thermoelectric heat pump. The air-to-liquid heat exchanger is associated with an electronics rack and disposed at an air-inlet side of the electronics rack, wherein an airflow enters the electronics rack at the air-inlet side and egresses from the electronics rack at an air-outlet side, and the air-to-liquid heat exchanger cools, at least in part, the airflow into the electronics rack. The coolant loop facilitates coolant flow through air-to-liquid heat exchanger, and includes a first loop portion and a second loop portion. The air-to-liquid heat exchanger exhausts heated coolant to the first loop portion and receives cooled coolant from the second loop portion. The heat rejection unit is coupled to the coolant loop between the first loop portion and the second loop portion, and rejects heat from the heated coolant passing through the first loop portion to provide partially-cooled coolant to the second loop portion. The at least one thermoelectric heat pump is disposed with the first loop portion of the coolant loop coupled to a first side of the at least one thermoelectric heat pump, and the second loop portion of the coolant loop coupled to a second side of the at least one thermoelectric heat pump. The at least one thermoelectric heat pump transfers heat from the partially-cooled coolant within the second loop portion to the heated coolant within the first loop portion to provide the cooled coolant for the air-to-liquid heat exchanger.

In another aspect, a data center is provided which includes multiple electronics racks and a cooling apparatus for cooling an electronics rack of the multiple electronics racks. The cooling apparatus includes an air-to-liquid heat exchanger, a coolant loop, a heat rejection unit, and at least one thermoelectric heat pump. The air-to-liquid heat exchanger is associated with the electronics rack and disposed at an air-inlet side of the electronics rack, wherein an airflow enters the electronics rack at the air-inlet side and egresses from the electronics rack at an air-outlet side, and the air-to-heat liquid exchanger cools, at least in part, the airflow into the electronics rack. The coolant loop facilitates coolant flow through the air-to-liquid heat exchanger, and includes a first loop portion and a second loop portion. The air-to-liquid heat exchanger exhausts heated coolant to the first loop portion and receives cooled coolant from the second loop portion. The rejection unit is coupled to the coolant loop between the first loop portion and the second loop portion, and rejects heat from the heated coolant passing through the first loop portion to provide partially cooled coolant to the second loop portion. The at least one thermoelectric heat pump is disposed with the first loop portion of the coolant loop coupled to a first side of the at least one thermoelectric heat pump, and the second loop portion of the coolant loop coupled to a second side of the at least one thermoelectric heat pump. The at least one thermoelectric heat pump transfers heat from the partially cooled coolant within the second loop portion to the heated coolant within the first loop portion to provide the cooled coolant for the air-to-liquid heat exchanger.

In a further aspect, a method is provided which includes selectively providing rack level cooling of an airflow entering an air-inlet side of an electronics rack to facilitate cooling one or more electronic components of the electronics rack. The selectively providing includes: providing an air-to-liquid heat exchanger in association with the electronics rack, disposed at the air-inlet side of the electronics rack, the air-to-liquid heat exchanger extracting heat from the airflow entering the electronics rack and dissipating the heat to coolant passing through the air-to-liquid heat exchanger; coupling a coolant loop to the air-to-liquid heat exchanger, the coolant loop comprising a first loop portion and a second loop portion, the air-to-liquid heat exchanger exhausting heated coolant to the first loop portion and receiving cooled coolant from the second loop portion; providing a heat rejection unit coupled to the coolant loop between the first loop portion and the second loop portion, the heat rejection unit rejecting heat from the heated coolant passing through the first loop portion to provide partially cooled coolant to the second loop portion; and providing at least one thermoelectric heat pump disposed with the first loop portion of the coolant loop coupled to a first side of the at least one thermoelectric heat pump, and the second loop portion of the coolant loop coupled to a second side of the at least one thermoelectric heat pump, wherein the at least one thermoelectric heat pump transfers heat from the partially cooled coolant within the second loop portion to the heated coolant within the first loop portion to provide the cooled coolant for the air-to-liquid heat exchanger.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

In a conventional air-cooled data center, multiple electronics racks may be disposed in one or more rows, with the data center housing several hundred, or even several thousand, microprocessors within the electronics racks. Note that "electronics rack", "rack unit", "rack", "information technology (IT) rack", etc., may be used interchangeably herein, and unless otherwise specified, include any housing, frame, support, structure, compartment, etc., having one or more heat-generating components of a computer system, electronic system, IT system, etc.

Note further that reference is made below to the drawings, which are not drawn to scale for ease of understanding of the various aspects of the present invention, wherein the same reference numbers used throughout different figures designate the same or similar components.

Figure 1:
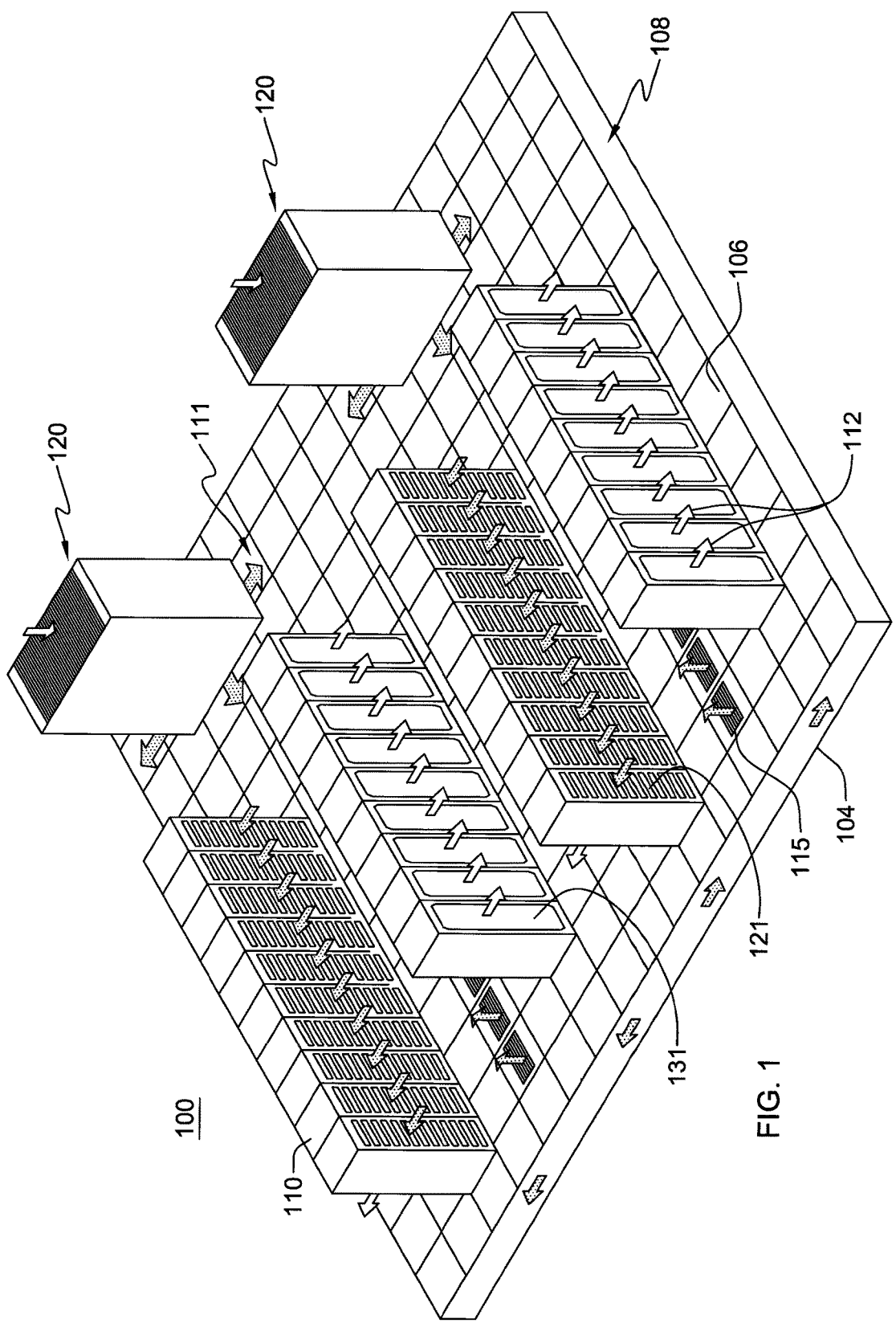
FIG. 1 depicts one embodiment of a conventional raised floor layout of an air-cooled data center.

FIG. 1 depicts one embodiment of a data center 100, which in one example, is a raised floor layout of an air-cooled computer installation or data center 100. Data center 100 includes electronics (or information technology (IT)) racks 110 disposed in one or more rows on a raised floor 106 of data center 100. One or more computer room air-handling units (CRAHs) 120 (also referred to as computer room air-conditioners (CRACs)) take in hot air (for example, through one or more air inlet vents in the top of the CRAHs) and exhaust cooled air into a sub-floor plenum 108 below raised floor 106. Hot airflow through data center 100 is depicted by light arrows 112, and chilled airflow through data center 100 is indicated by stippled arrows 111.

In FIG. 1, electronics racks 110 employ a front-to-back cooling approach. Namely, according to this approach, cooled air 111 is drawn in through a front or air-inlet side 121 of each rack, and hot air 112 is exhausted from a back or air-outlet side 131 of each rack. The cooled air drawn into the front of the rack is supplied to air inlets of the electronic components (e.g., servers) disposed within the IT racks. Space between raised floor 106 and a sub-floor 104 defines the sub-floor plenum 108. Sub-floor plenum 108 serves as a conduit to transport, for example, cooled air 111 from the air-conditioning units 120 to the electronics racks 110. In one embodiment, electronics racks 110 are arranged in a hot aisle/cold aisle configuration, with their air-inlet sides and air-outlet sides disposed in alternating directions, as illustrated in FIG. 1. Cooled air 111 is provided through one or more perforated floor tiles 115 in raised floor 106 from sub-floor plenum 108 into the cold aisles of the data center. The cooled air 111 is then drawn into electronics rack 110, via their inlets, and subsequently exhausted into the data center via one or more air outlets of the individual electronics racks into the hot aisles of the data center.

Figure 2:
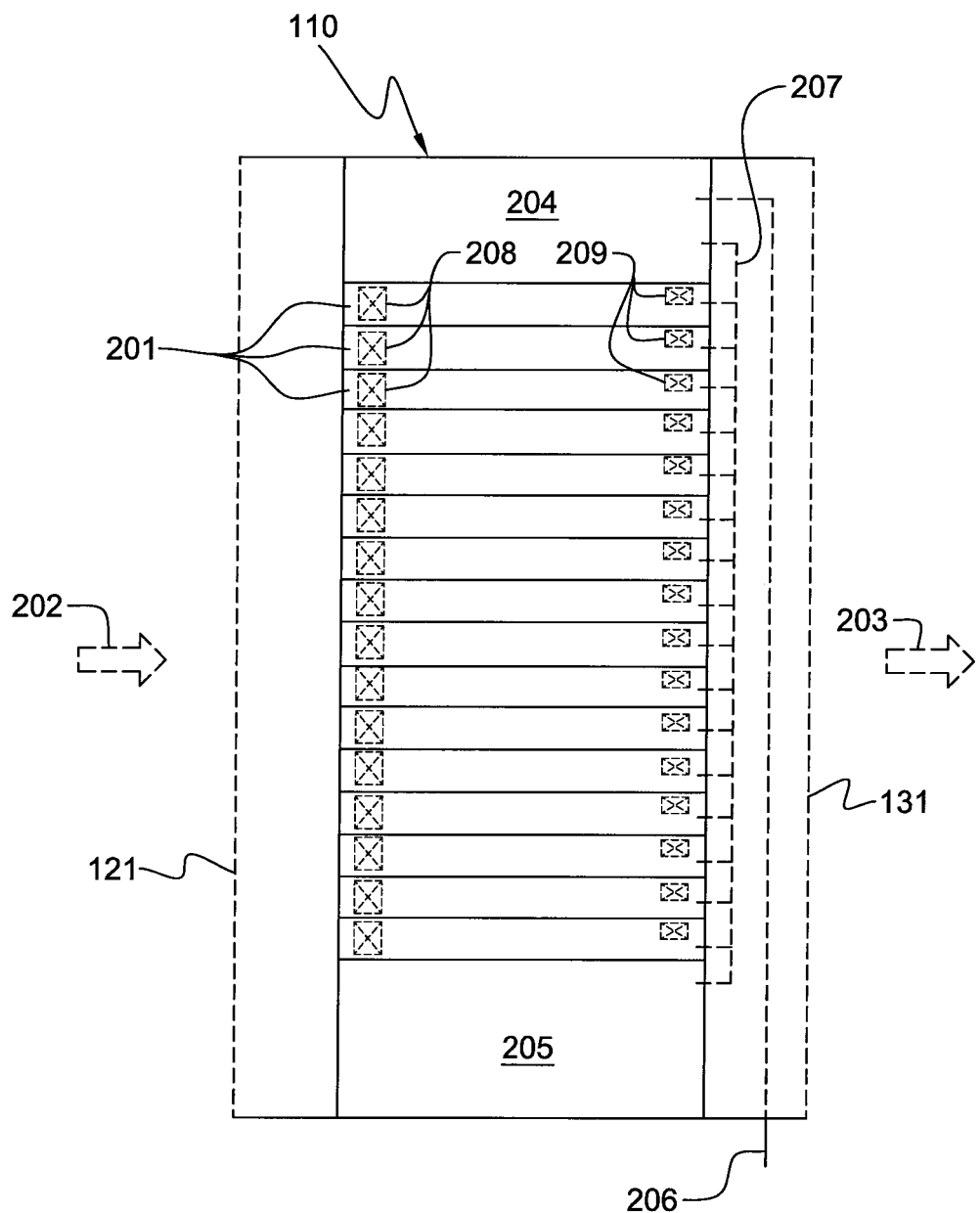
FIG. 2 is an elevational schematic of one embodiment of an electronics rack comprising multiple electronic systems or nodes to be cooled, in accordance with one or more aspects of the present invention.

FIG. 2 depicts (by way of example) one embodiment of an electronics rack 110 with a plurality of electronic systems 201 to be cooled. In the embodiment illustrated, electronic systems 201 are air-cooled by cool airflow 202 ingressing via air-inlet side 121, and exhausting out air-outlet side 131 as heated airflow 203. By way of example, one or more air-moving assemblies 208 may be provided at the air-inlet sides of electronic systems 201 and/or one or more air-moving assemblies 209 may be provided at the air-outlet sides of electronic systems 201 to facilitate airflow through the individual systems 201 as part of the cooling apparatus of electronics rack 110. For instance, air-moving assemblies 208 at the air inlets to electronic systems 201 may be or include axial fan assemblies, while air-moving assemblies 209 disposed at the air outlets of electronic systems 201 may be or include centrifugal fan assemblies. One or more electronic systems 201 may include heat-generating components to be cooled of, for instance, an electronic subsystem, and/or information technology (IT) equipment. More particularly, one or more of the electronic systems 201 may include one or more processors and associated memory.

In one embodiment, electronics rack 110 may also include, by way of example, one or more bulk power assemblies 204 of an AC to DC power supply assembly. AC to DC power supply assembly further includes, in one embodiment, a frame controller, which may be resident in the bulk power assembly 204 and/or in one or more electronic systems 201. Also illustrated in FIG. 2 is one or more input/output (I/O) drawer(s) 205, which may also include a switch network. I/O drawer(s) 205 may include, as one example, PCI slots and disk drives for the electronics rack.

In the depicted implementation, a three-phase AC source feeds power via an AC power supply line cord 206 to bulk power assembly 204, which transforms the supplied AC power to an appropriate DC power level for output via distribution cable 207 to the plurality of electronic systems 201 and I/O drawer(s) 205. The number of electronic systems installed in the electronics rack is variable, and depends on customer requirements for a particular system. Note that the particular electronics rack 110 configuration of FIG. 2 is presented by way of example only, and not by way of limitation.

Due, in part, to the ever-increasing airflow requirements to electronics racks, and limits of air distribution within the typical computer room installation, recirculation problems within the room may occur. For instance, in a conventional non-raised floor layout, hot air recirculation may occur from the air-outlet sides of the electronics rack back to the cold air aisle defined by the opposing air-inlet sides of the electronics racks. This recirculation can occur because the conditioned air supplied through the floor tiles is typically only a fraction of the airflow rate forced through the electronics racks by the air-moving devices disposed within the racks. This can be due, for example, to limitations on tile sizes (or diffuser flow rates). The remaining fraction of the supply of inlet-side air may be made of ambient room air through recirculation. This recirculating flow is often very complex in nature, and can lead to significantly higher rack unit inlet temperatures than might be expected.

Recirculation of hot air from the hot air aisle of the computer room installation to the cold air aisle can be detrimental to the performance and reliability of the computer system(s) or electronic system(s) within the rack(s). Typically, data center equipment has been designed to operate with rack air-inlet temperatures in the 15-35° C. range. For a raised floor layout such as depicted in FIG. 1, temperature can range from 15-20° C. at the lower portion of the rack, close to the cool airflow vents, to as much as 32-42° C. at the upper portion of the electronics racks, where hot air can form a self-sustaining recirculation loop. Since the allowable rack heat load is limited by the rack inlet-air temperature at the "hot" part, this temperature distribution correlates to an inefficient utilization of available air-conditioning capability. Computer installation equipment almost always represents a high capital investment to the customer. Thus, it is of significant importance, from a product reliability and performance viewpoint, and from a customer satisfaction and business perspective, to achieve a substantially uniform temperature across the air-inlet side of the rack unit.

In addition, the American Society of Heating Refrigeration and Air-Conditioning Engineers (ASHRAE) published ASHRAE 2011 environmental standards for electronics racks (such as IT equipment), wherein two new environmental envelopes were created to assist in improving data center efficiency, and reducing energy consumption in comparison with maintaining the narrower environmental envelopes previously specified. The two new standards are referred to as the A3 Class and A4 Class, which allow air temperatures entering the IT equipment to be as high as 40° C. and 45° C., respectively. Currently, many electronics racks (or IT equipment) are still designed for the A2 environment, where the air-inlet temperature has a maximum 35° C., as noted above.

To take advantage of the new ASHRAE standards, one solution is to redesign the equipment so that the higher inlet-air temperatures could be tolerated. This could be accomplished by providing more heat-exchange surfaces within the rack, increasing airflow through the rack by ramping up the rack's air-moving devices, or even adding liquid-cooling to the electronics racks. For instance, one solution to cooling a data center would be to provide air-to-liquid heat exchangers at the air-outlet sides of the electronics racks, which facilitate localized cooling within the data center. For instance, the coolant delivered to these heat exchangers would be warm temperature liquid that tracks outdoor ambient temperature, which advantageously would partially, or fully, eliminate the need for mechanical refrigeration. However, some components within the electronics rack (such as high-density, hard disk drives), often cannot have extended surfaces, and cannot be liquid-cooled. Certain electronic components may also show an increase in failure rates as the temperature rises, which is often unacceptable. Tape-based storage racks also suffer at higher temperature, at least in part, due to the increased aging and stress on the polymer tape media.

Thus, one solution is to further cool a data center containing IT equipment that is not certified to the elevated cooling limits, for instance, a data center that houses both compute and storage hardware. In these cases, the liquid being delivered to the IT data center would need (in one approach) to be sufficiently cooled to meet the needs of the hardware with the lowest temperature requirement, while over-cooling any equipment certified for higher temperatures, thus eliminating the energy benefits of warm liquid-cooling.

An alternative solution to these issues, particularly for electronics racks comprising high-performance, graphics-processing units (GPUs), hard disk drives (HDDs), or tape-based computer storage (i.e., tape media), is to selectively reduce the air temperature at the air-inlet side of one or more selected electronics racks. This might be achieved by adding a heat exchanger door, to the air-inlet side of the rack to pre-cool the air from, for instance, 40° C. to 35° C., or lower. One embodiment of this is depicted in the exemplary data center of FIG. 3.

Figure 3:
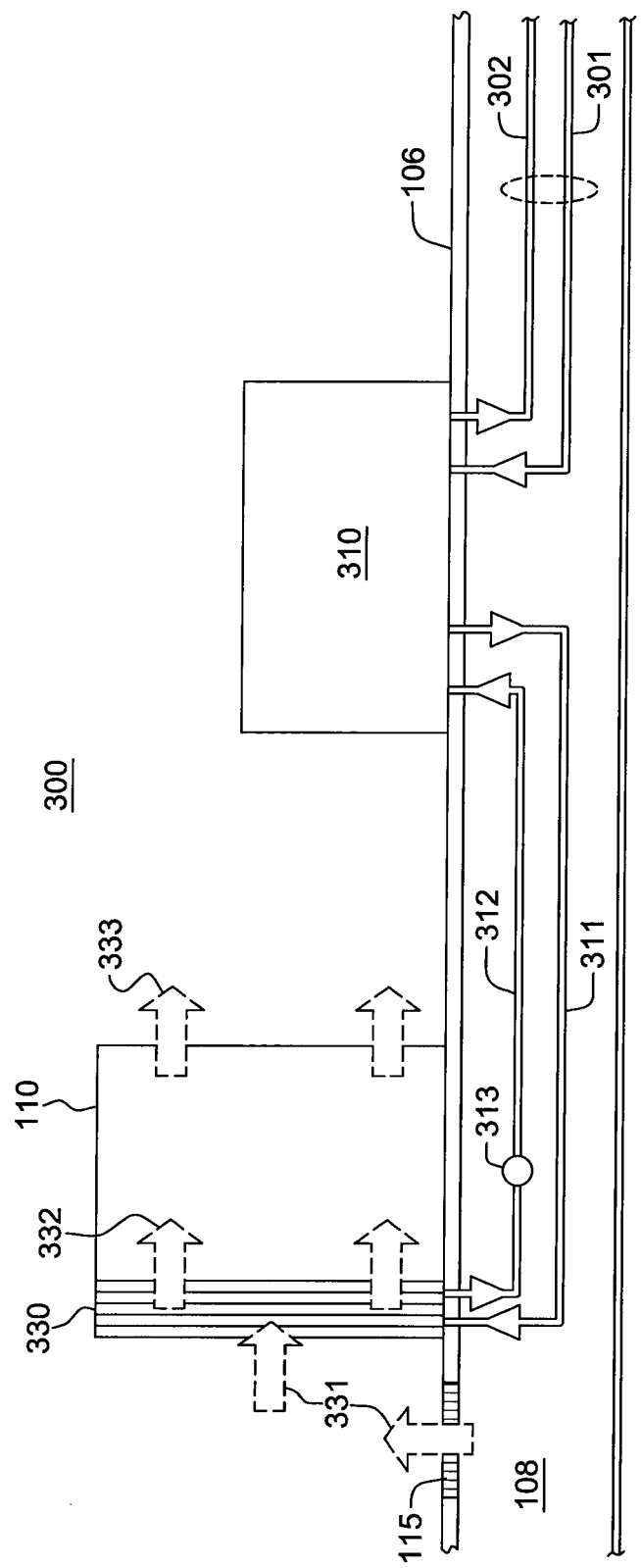
FIG. 3 depicts one embodiment of a data center implementing another cooling approach, wherein an electronics rack is provided with an inlet-air-cooling door assembly disposed at the air-inlet side thereof, in accordance with one or more aspects of the present invention.

FIG. 3 depicts one embodiment of a data center, generally denoted 300, comprising one or more electronics racks 110, and one or more coolant distribution units 310 disposed, in the illustrated example, on a raised floor 106 of the data center. In actual implementation, the data center 300 may comprise a plurality of electronics racks 110, as well as multiple coolant-distribution units, and one or more computer room air-conditioning units (not shown). In this implementation, a door assembly 330 is provided disposed at the air-inlet side of electronics rack 110 to facilitate further cooling of ingressing airflow 331 to reduce temperature of the airflow 332 entering electronics rack 110, and thereby provide cooling of the air-cooled electronic components within the rack. Heated exhaust air 333 exits the air-outlet side of the electronics rack 110. Cooled air 331 may be provided, in one embodiment, through one or more perforated floor tiles 115, with conditioned and cooled air being supplied to plenum 108 by one or more air-conditioning units (not shown).

Coolant distribution unit 310 may comprise, for instance, a pumping unit which includes a coolant-to-liquid heat exchanger, where heat is transferred from a system coolant loop to a facility coolant loop. For example, in operation, chilled facility coolant, such as water, is received via facility coolant supply line 301, and returned via facility coolant return line 302. System coolant, such as water, is provided via a system coolant supply manifold 311, and is returned via a system coolant return manifold 312. In one embodiment, the system coolant supply and return manifolds 311, 312 may be hard-plumbed within the data center, for instance, within air supply plenum 108, such as illustrated in FIG. 3, and may be pre-configured to align under and include branch lines (or hoses) extending towards one or more electronics racks in a respective row of racks. One or more flow control valves 313 may be associated with, for instance, system coolant return manifold 312, to facilitate control of system coolant flow through the associated cooling door assemblies 330. As noted, door assembly 330 may be configured to be disposed at the air-inlet side of the electronics rack, and may be an inlet-air-cooling door assembly configured to provide cooled air that meets a specified ASHRAE standard, for instance, an air temperature of 35° C. (i.e., the A2 ASHRAE standard), or lower. Heat extracted by the one or more air-to-coolant heat exchangers of the door assembly is rejected to (in this embodiment) the system coolant, which is transferred via the one or more coolant distribution units to the facility coolant, and subsequently dissipated via chillers, and cooling towers, or via dry-coolers or other liquid-side economizers, etc.

Figure 4:
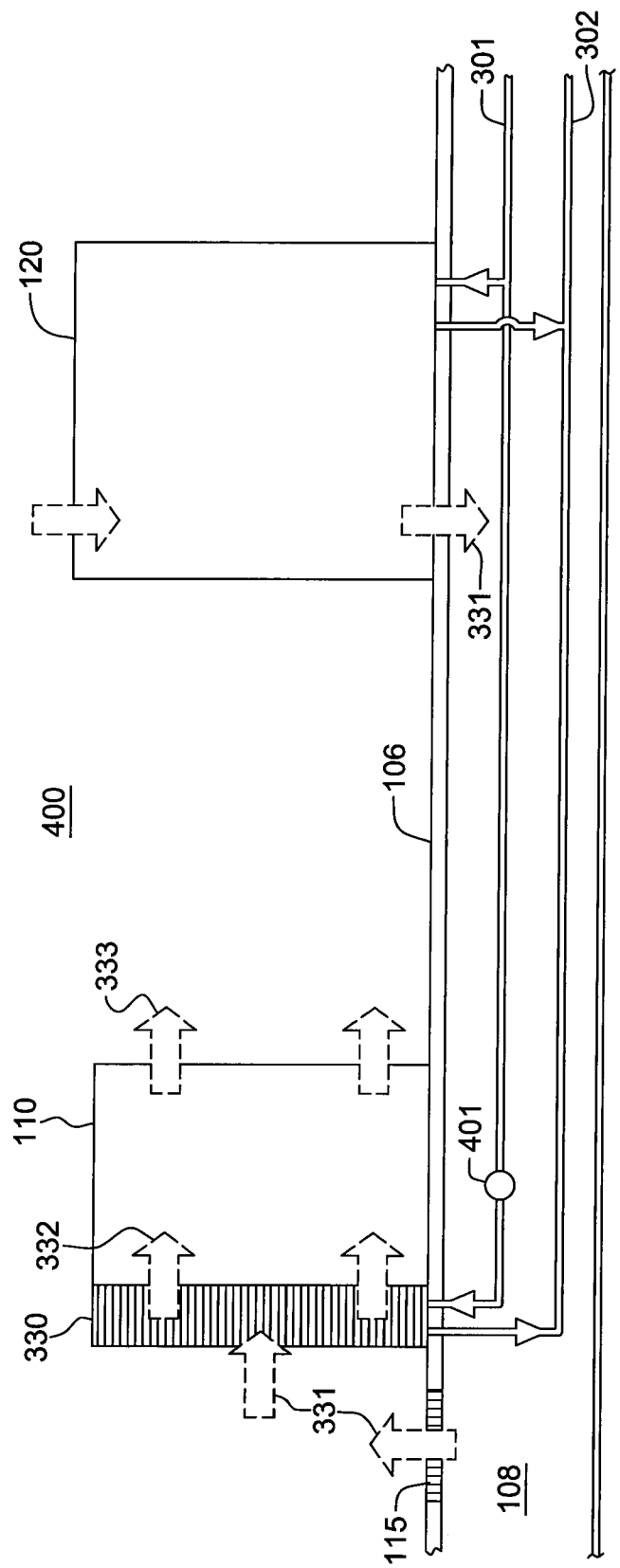
FIG. 4 depicts a further embodiment of a data center implementing a cooling approach where an electronics rack is provided with an inlet-air-cooling door assembly disposed at the air-inlet side thereof, in accordance with one or more aspects of the present invention.

Another solution is depicted in FIG. 4, wherein a data center 400 comprising one or more electronics racks 110, and a computer room air-handling unit 120 are disposed on a raised floor 106 of the data center. As in the embodiments above, in actual implementation, data center 400 may comprise a plurality of electronic racks 110, as well as multiple computer room air handling units 120. In this implementation, door assembly 330, comprising an air-to-liquid heat exchanger, is provided at the air-inlet side of electronics rack 110 to facilitate further selected cooling of ingressing airflow 331 to reduce temperature of airflow 332 entering electronics rack 110, and thereby provide enhanced cooling of the air-cooled electronic components within the rack. Heated exhaust air 333 exits the air-outlet side of electronics rack 110, as described above. Cool air 331 may be provided, in one or more embodiments, by one or more perforated tiles 115, which may comprise floor tiles or overhead tiles depending on the implementation, with the conditioned and cooled air being supplied to plenum 108 by one or more air-conditioning units of the computer room air-handling unit 120.

Computer room air-handing unit 120 may include an air-to-liquid heat exchanger for cooling ambient room air for return via, for instance, under floor plenum 108 to the cold air aisles of the data center. In the depicted implementation, heat is transferred from the airflow passing through computer room air-handing unit 120 to, for instance, chilled facility coolant in a facility coolant loop. For instance, in operation, chilled facility coolant, such as water, may be received by a facility coolant supply line 301, and returned by a facility coolant return line 302. In this implementation, facility coolant supply and return lines 301, 302 also provide facility coolant to air-inlet side door assemblies 330 associated with one or more selected electronics racks 110 of data center 400. In one implementation, the facility coolant may be provided in parallel to the door assemblies 330 and computer room air-handling unit(s) 120. One or more flow control valves 401 may be associated with, for instance, facility coolant supply line 301 to facilitate control of facility coolant flow through the associated door assemblies 330. As in the above implementation, door assembly 330 may be, in one or more implementations, configured to be disposed at the air-inlet side of the electronics rack, and may be an inlet-air-cooling door assembly configured to provide cooled air that meets a specified ASHRAE standard. The heat extracted by the one or more air-to-coolant heat exchangers of the door assembly is subsequently dissipated by one or more chillers (not shown). Note that in this embodiment the computer room air-handling unit may be cooling one or more electronics racks that do not have the same inlet air temperature specifications as the selected electronics rack 110 with the inlet air-cooling door assembly 330. Therefore, the remote refrigeration chiller may be required to provide a low temperature coolant to satisfy the entire data center.

In the examples of FIGS. 3 & 4, air-inlet temperature to selected electronics racks within the data center may be cooled to meet the required temperature standards for the equipment within that electronics rack. However, in both embodiments, a remote refrigeration chiller is required to supply chilled coolant, such as chilled water, to either a coolant distribution unit, as in the embodiment of FIG. 3, or a computer room air-handling unit (CRAH), as in the embodiment of FIG. 4.

Figure 5:
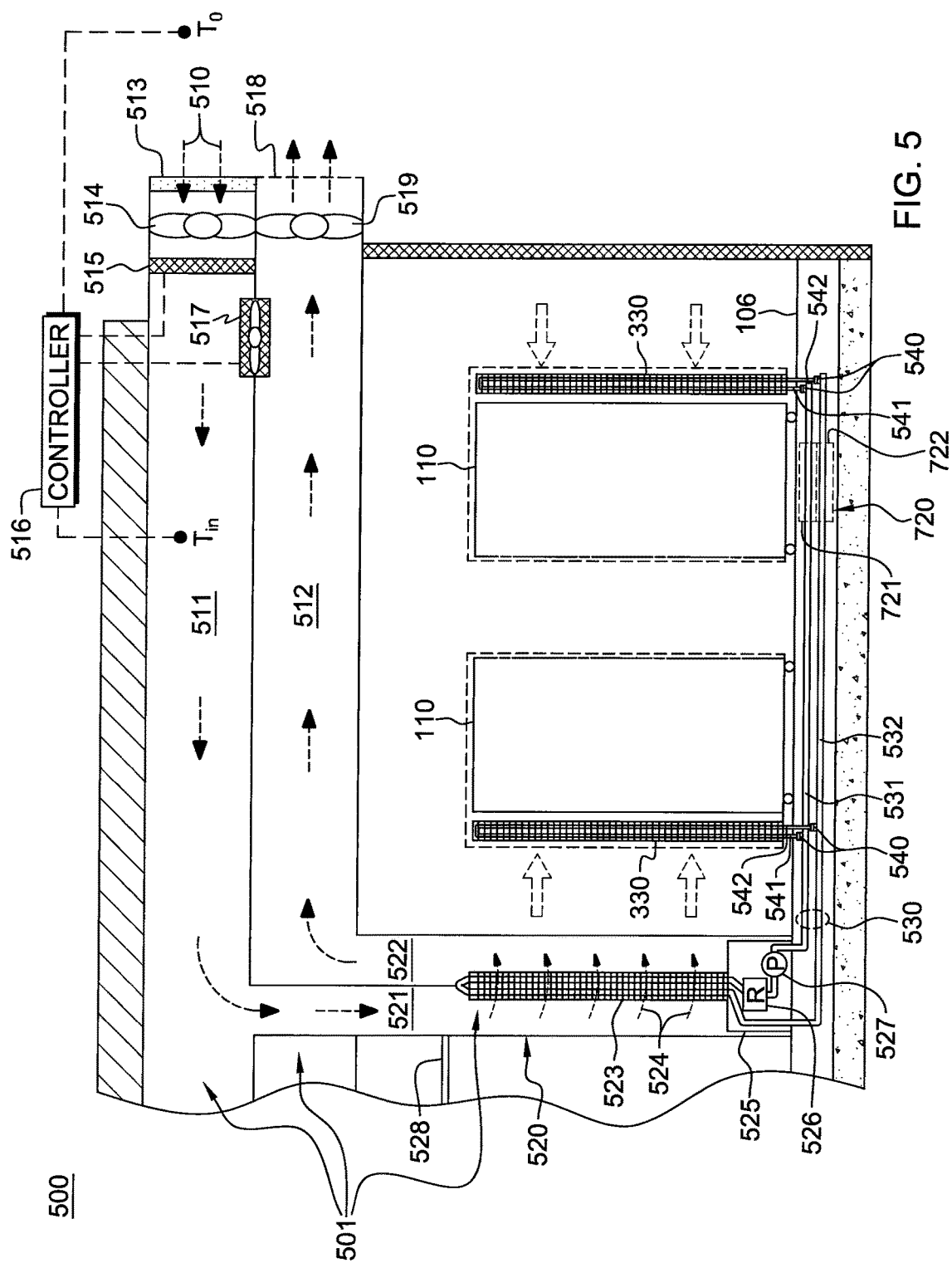
FIG. 5 is a schematic of an alternate embodiment of a data center comprising a cooling apparatus, including an air-side economizer and one or more inlet-air-cooling door assemblies disposed at the air-inlet sides of selected electronics racks of the data center, in accordance with one or more aspects of the present invention.

FIG. 5 depicts an alternate air-side economizer system implementation. In the example of FIG. 5, a data center 500, is shown comprising a cooling apparatus which includes an air-side economizer 501 for cooling one or more electronics racks 110 of the data center. Data center 500 may include one or more cooling stations 520, each of which may be, in one instance, a shared, central cooling station providing cooling to multiple electronics racks 110. In certain implementations, air-cooling station(s) 520 may be separated free standing from electronics racks 110, and include (in one or more embodiments) a vertically extending, liquid-to-air heat exchanger 523 and supply and return ducting 521, 522 for directing a cooling-air flow 524 across liquid-to-air heat exchanger 523.

In the embodiment depicted in FIG. 5, the cooling apparatus further includes a coolant-loop 530 coupled in fluid communication to one or more inlet air-cooling door assemblies 330 associated with selected electronics racks 110 within data center 500. As noted, each inlet-air-cooling door assembly 330 provides cooling of ingressing airflow into the associated electronics rack to facilitate cooling of one or more electronic components within the rack. In one or more implementations, the inlet air-cooling door assemblies share a central liquid-to-air heat exchanger 523. For instance, a centralized, air-cooled cooling station 520 comprising liquid-to-air heat exchanger 523 could service a large portion of the data center, or even the full data center, in the case of a small to medium facility. Advantageously, the use of one or more centralized cooling stations allows for the use of larger radiator coils and larger ducts to transport outdoor cooling air-flow to the centralized location(s).

As illustrated in the embodiment of FIG. 5, liquid-to-air heat exchanger 523 of central air-cooled cooling station 520 includes one or more coolant flow tubes through which the heated coolant circulates for dissipation of heat to the cooling airflow passing across the liquid-to-air heat exchanger 523. Liquid-to-air heat exchanger 523 further includes, in this example, a plurality of air-cooling fins which may be, in one example, oriented horizontally within the liquid-to-air heat exchanger 523. As illustrated, the air-cooled cooling station 520 may further include a central coolant distribution unit 525 comprising a coolant reservoir 526 and one or more coolant pumps 527 for pumping cooled coolant via a coolant supply manifold 531 to the air inlet cooling door assemblies 330 associated with the electronics racks within the data center. Heated coolant is exhausted by a common coolant return manifold 532 for return to the liquid-to-air heat exchanger 523.

As illustrated, an airflow damper 528 may be provided to control the amount coolant airflow 524 flowing through supply ducting 521 to liquid-to-air heat exchanger 523. In the embodiment of FIG. 5, air-side economizer 501 further includes a cooling airflow supply plenum 511 and an airflow exhaust plenum 512. Cooling airflow supply plenum 511 receives outdoor air 510 after being drawn across a filter 513 via an outdoor air-intake fan 514. In the embodiment depicted, an evaporative cooling system 515 and a controller 516 may be provided to selectively cool the outdoor air, depending upon its temperature.

In one embodiment, cooling airflow 524 may be provided in parallel to the supply ducting 521 of multiple shared central cooling stations 520 of data center 500, and the heated airflow maybe exhausted by a return ducting 522 in parallel from the multiple cooling stations 520 to the airflow exhaust plenum 512. By way of example only, the cooling airflow supply plenum 511 and airflow exhaust plenum 512 may comprise overhead plenums within the data center.

FIG. 5 also illustrates a controllable recirculation fan (and louver system (not shown)) 517, which comprises a fan that is selectively controlled, for instance, during winter months, in order to recirculate a portion of the heated airflow exhaust in the airflow exhaust plenum 512 directly into the airflow supply plenum 511 for mixing with the cold outdoor air 510, drawn into the cooling apparatus. In winter operation, the evaporative cooling system 515 would be shut off by controller 516.

To summarize, in operation, outdoor air 510 is drawn in through, for example, particulate filter 513, and may be forced through an evaporative cooling system 515, after which it is distributed via the cooling airflow supply plenum 511 to various parts of data center 500. The cooling airflow supply plenum 511 feeds one or more vertical supply ducts 521 with cooling airflow 524, and this cooling airflow passes through the respective liquid-to-air heat exchangers 523, and returns via vertical return ducting 522, to airflow exhaust plenum 512, where it is exhausted through an exhaust vent 518 by an exhaust fan 519 to the outside of the data center. While the intake and exhaust openings to the cooling airflow supply plenum 511 and airflow exhaust plenum 512, respectively, are shown in FIG. 5 adjacent to each other, in reality, the intake and exhaust openings may be disposed remote from each other. By remotely disposing the intake and exhaust openings, any mixing of the warm exhaust air with the cooler intake air can be avoided. As noted, in winter months, when the outdoor air temperature may be quite cold, the outdoor air temperature may be heated by recirculating the warmer exhaust air (as shown in FIG. 5) wherein the controllable recirculation fan 517 is provided, along with an appropriate opening, to facilitate controlled heating of the intake air using the warmer exhaust air stream.

As noted above, the cooling apparatus further includes air inlet cooling door assemblies 330 associated with selected electronics racks 110 of data center 500. Each door assembly may include an air-to-liquid heat exchanger with a rack-level coolant supply plenum 541 and a rack-level coolant return plenum 542, which are separately coupled to the coolant supply manifold 531 and coolant return manifold 532, described above. Quick connect couplings 540 may be provided to facilitate connection of the respective rack-level plenums to the coolant supply and return manifolds 531, 532.

Figure 6:
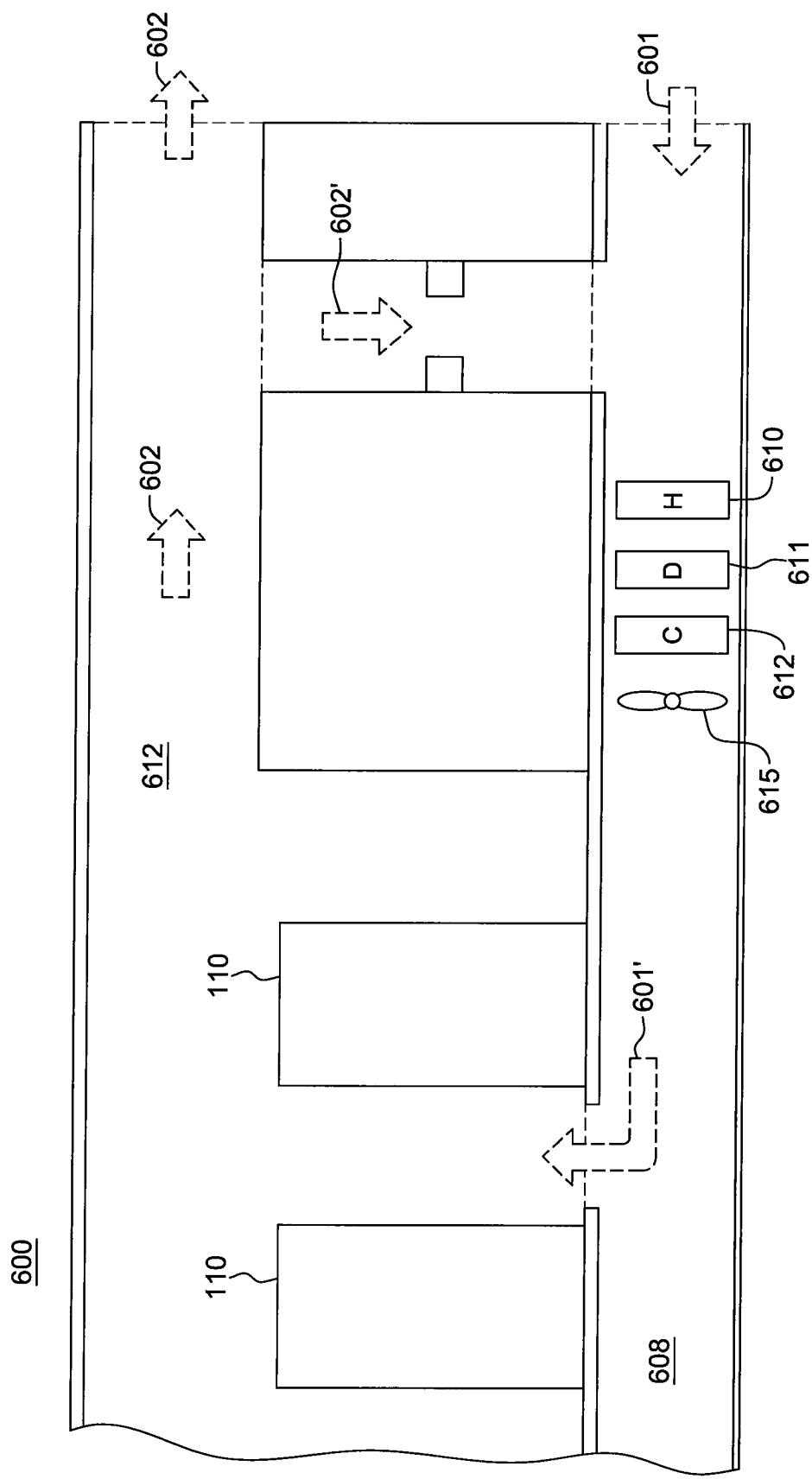
FIG. 6 is a schematic of another embodiment of an air-side economizer cooling approach for a data center, which may employ a rack-level cooling apparatus to further cool selected electronics racks and the components therein, in accordance with one or more aspects of the present invention.

FIG. 6 depicts an alternate implementation of a data center 600 utilizing an air-side economizer cooling apparatus. In this implementation, the data center is a raised floor data center comprising multiple electronics racks 110, disposed, for instance, in one or more rows as described above. Outdoor air 601 is drawn into a cool-air plenum 608 through, for instance, a particle filter (not shown), a humidification 610 and dehumidification 611 system, as well as a cooling system 612 driven by an outdoor air intake fan 615. The conditioned outdoor airflow 601' is provided as cooled air to the electronics racks 110 of data center 600 for air-cooling of one or more electronic components within the electronics racks. Heated airflow 602 is exhausted via an airflow plenum 612, with a portion of the heated airflow 602' potentially being redirected through a recirculation path from airflow exhaust plenum 612 to cool-air supply plenum 608 for mixing with outdoor air 601, as described above. A controller (not shown) may again be provided to control the amount of recirculating heated airflow 602' back into cool-air supply plenum 608, dependent, for instance, on outdoor air temperature. Note that in one or more implementations, the humidifying 610 and dehumidifying 611 system(s) and cooling system 612 may obtain their thermal capabilities from a remote chiller, such as a refrigeration chiller (not shown). The electronics racks are cooled with the cooled and/or conditioned air, which then leaves the data center as heated air and is exhausted to the ambient environment, or possibly recirculated to provide the desired thermal conditioning to the incoming outdoor air. The air-side economizer system of FIG. 6 may be appropriate for data centers where the ambient environment is acceptable.

Figure 7:
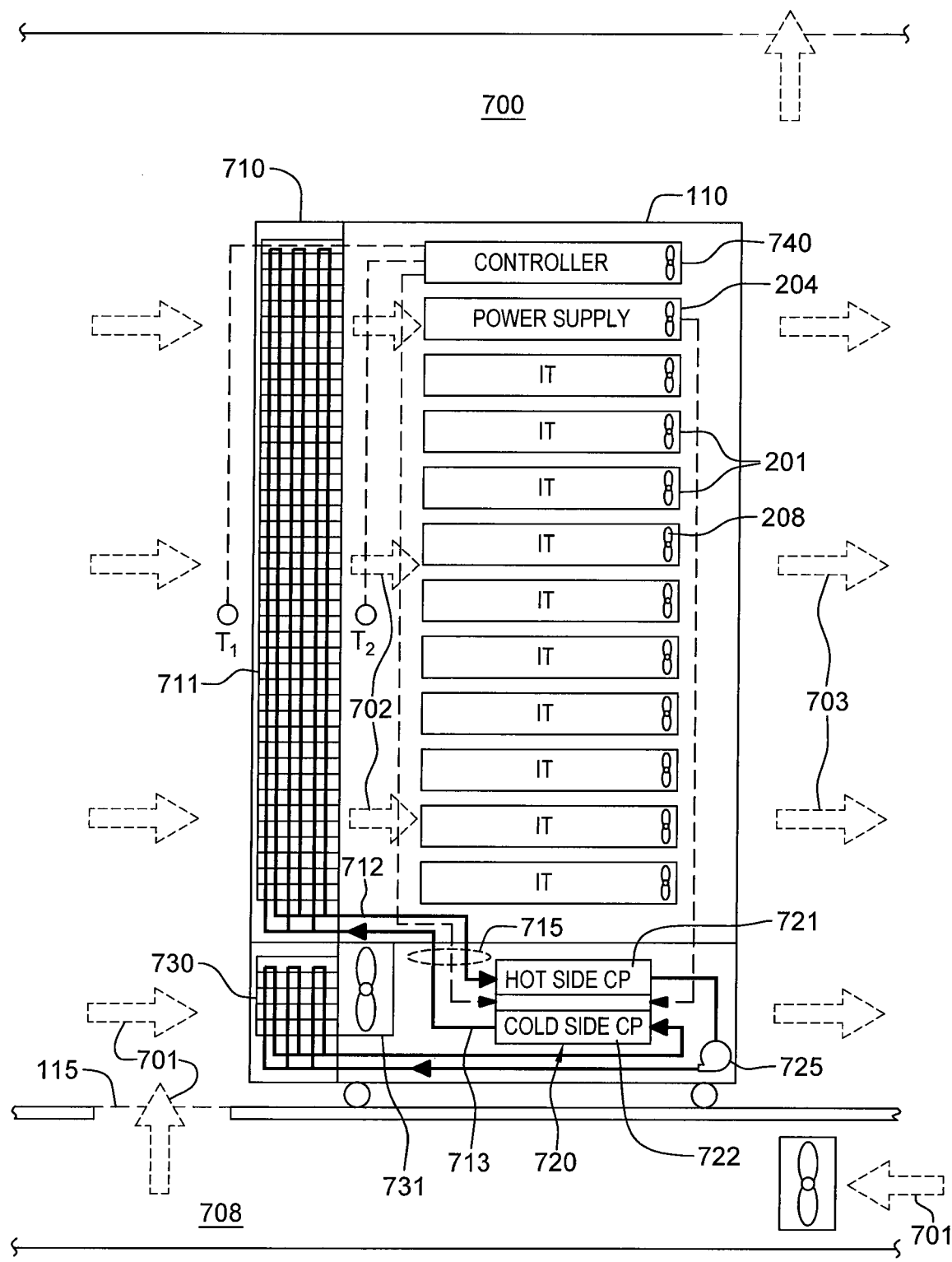
FIG. 7 is a schematic of one embodiment of an electronics rack and associated cooling apparatus, configured as a rack-level cooling apparatus, in accordance with one or more aspects of the present invention.

FIG. 7 depicts a further embodiment of a data center 700, which utilizes one or more air-inlet-cooling door assemblies 710 associated with one or more electronics racks 110 to selectively cool airflow into the respective electronics rack without the use of a remote chiller. Advantageously, described herein is the use of one or more thermoelectric heat pumps or modules housed, for instance, within or in association with the electronics rack and coupled fluidly to the coolant passing through the air-to-liquid heat exchanger of an air-inlet-cooling door assembly. With the implementations disclosed herein, a data center that houses both low-temperature and high-temperature specified electronics racks may selectively use cooling apparatuses such as disclosed to ensure that airflow into each electronics rack meets the specified air-inlet temperature for that rack. In one or more implementations, rack-level, thermoelectric-enhanced cooling is provided with the cold side of the thermoelectric heat pump(s) being coupled to coolant flowing into the coolant inlet of the air-to-liquid heat exchanger to provide localized refrigeration to the coolant being supplied to the heat exchanger within the door assembly. This lower temperature coolant is able to cool the airflow into the electronics rack to meet the air temperature requirements desired for the electronics rack. The coolant leaving the air-to-liquid heat exchanger is connected fluidly to the hot-side of the thermoelectric pump(s), thus providing the required heat sink for the thermoelectric power dissipation. Advantageously, the cooling apparatus depicted in FIG. 7 allows for the energy benefits of warm temperature cooling of those electronics racks of a data center rated for the higher temperature ASHRAE standards, without the penalty of providing increased cooling for the entire data center, and thus better tailors data center energy consumption to meet the cooling requirements of disparate-rated racks within the data center.

Advantageously, the cooling solution disclosed herein is appropriate for data center configurations that require localized cooling to meet overall data center energy improvement by raising the data center temperature. Further, it is applicable to those electronics racks or IT systems that do not have a connection to a refrigeration facility, such as a remote chiller plant. For example, a remote telecommunications building that relies on the ambient environment to meet the thermal needs may utilize selected rack-level cooling, in accordance with one or more aspects of the present invention.

As noted, FIG. 7 depicts a data center 700 comprising one or more electronics racks 110, selected ones of which may have associated therewith a cooling apparatus comprising an air-to-liquid heat exchanger 711 which may be disposed, in certain implementations, within a door assembly 710 coupled to the air-inlet side of electronics rack 110, as illustrated.

In the embodiment of FIG. 7, electronics rack 110 is again shown populated with one or more electronics systems 201 (such as information technology systems), which are powered by a bulk power assembly 204. Axial fans 208 are associated with electronics systems 201 to provide a cooling airflow across the electronics systems. Note that the IT equipment within electronics rack 110 could be equipment for computing, networking, storage, etc. Electronics rack 110 is cooled by an airflow 701 (in this configuration) brought into the data center 700 via an underfloor plenum 708.

As shown, the cooling apparatus includes air-to-liquid heat exchanger 711 disposed within door assembly 710 at the air-inlet side of electronics rack 110. An airflow 701 enters the electronics rack through the door assembly at the air-inlet side of the rack, and egresses from the electronics rack as heated exhaust air 703. Air-to-liquid heat exchanger 711 further cools airflow 701 to provide cool inlet air 702 to electronics rack 110. Note that in other embodiments, air-to-liquid heat exchanger 711 could be otherwise attached to or associated with electronics rack 110, that is, rather than within a door assembly.

A coolant loop 715 is provided to facilitate coolant-flow through air-to-liquid heat exchanger 711. Coolant loop 715 includes a first loop portion 712 and second loop portion 713, with the air-to-liquid heat exchanger exhausting heated coolant to first loop portion 712 and receiving cooled coolant from second loop portion 713. A heat rejection unit, such as a radiator heat exchanger 730, is also coupled to coolant loop 715 between the first loop portion 712 and the second loop portion 713. The heat rejection unit 730 rejects heat from heated coolant passing through the first loop portion to provide partially-cooled coolant to the second loop portion. Note that in the implementation depicted (by way of example), heat rejection unit 730 is a radiator heat exchanger that is also disposed within door assembly 710. The heat rejection unit may be provided with an associated radiator air-moving device 731, which may draw cool air 701 across the radiator heat exchanger. In one or more implementations, radiator air-moving device 731 may be disposed within electronics rack 110 aligned, for instance, to heat rejection unit 730 located within door assembly 710.

As noted, thermoelectric-enhanced cooling provides the selective, auxiliary cooling disclosed herein. At least one thermoelectric heat pump or module 720 is disposed, for instance, within electronics rack 110 in the embodiment of FIG. 7, with the first-loop portions 712 of coolant-loop 715 coupled to a first-side of the thermoelectric heat pump or module(s) 720 and the second-loop portion 713 of coolant loop 715 coupled to a second side of thermoelectric module(s) 720.

By way of example, first loop portion 712 may comprise a first heat exchange element 721, such as a hot-side cold plate (CP), and second loop portion 713 of coolant loop 715 may comprise a second heat exchange element 722, such as a cold-side cold plate (CP). In this implementation, heated coolant in first loop portion 712 passes through first heat exchange element 721, and partially cooled-coolant in second loop portion 713 passes through second heat exchange element 722. As shown, first heat exchange element 721 is coupled to a first side of the thermoelectric heat pump(s) 720, and second heat exchange element 722 is coupled to a second side of the thermoelectric pump(s) to facilitate transfer of heat across the thermoelectric heat pump(s) 720 from the partially-cooled coolant passing through second heat exchange element 722 to the heated coolant passing through first heat exchange element 721. In one or more implementations, thermoelectric heat pumps(s) 720 may be powered from bulk power supply 204, and controlled by a controller 740, resident, for instance, in one or more electronic systems 201 of electronics rack 110. In one or more implementations, the cooling system may include temperature sensors $T_1$, $T_2$ associated with air-to-liquid heat exchanger 711 to sense the ingressing airflow temperature to the heat exchanger and egressing airflow temperature from the heat exchanger, and thereby facilitate separate rack-level control of the cooling provided to the associated electronics rack 110. A liquid coolant pump(s) 725 is associated with coolant loop 715 to facilitate circulating coolant through the coolant loop and the noted components are coupled in fluid communication therewith. Note that in the implementation of FIG. 7, heat rejection unit 730 rejects the total cooling load, as well as the work input to the thermoelectric heat pump(s) to the ambient airstream (that is, in an implementation where the heat rejection unit is a radiator-type heat exchanger). With a dedicated radiator air-moving device 731, the cooling apparatus of FIG. 7 does not rely on electronic system fans 208 to reject heat in the heat rejection unit.

Figure 8:
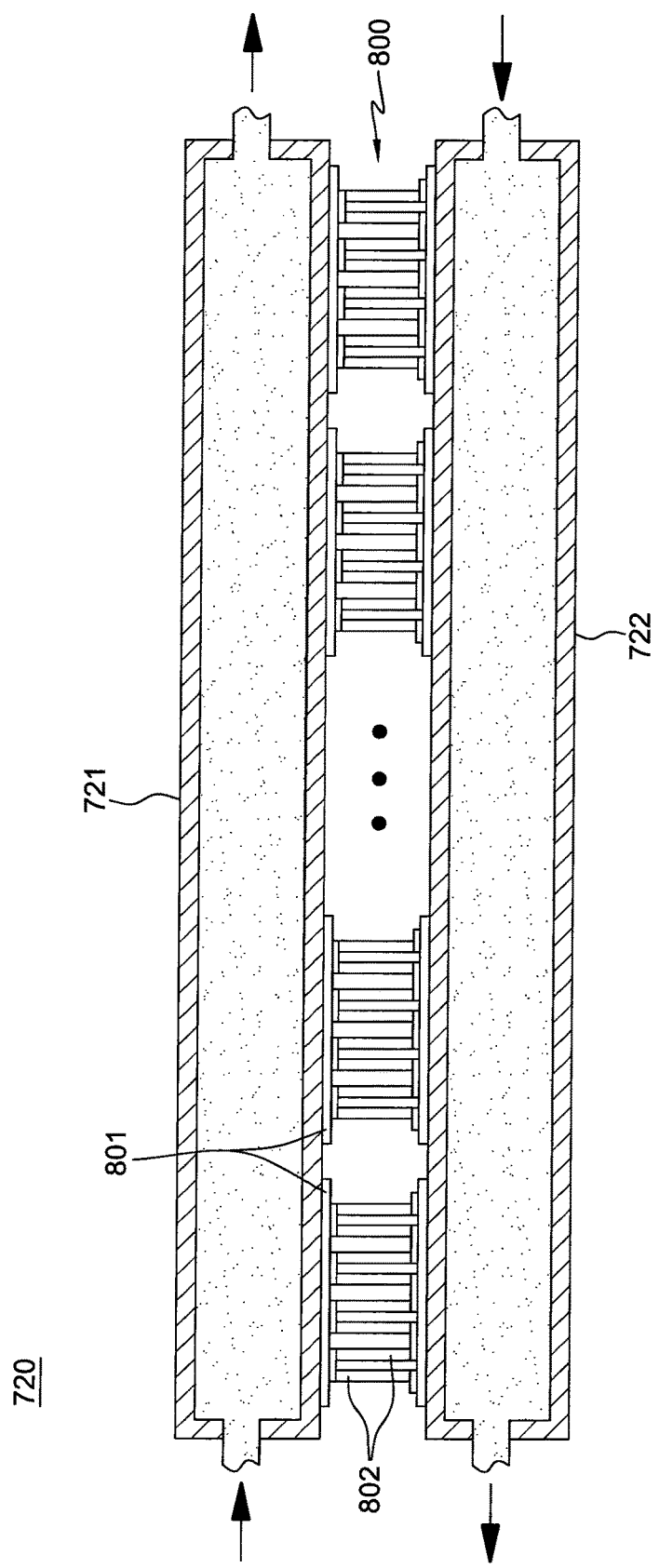
FIG. 8 is a cross-sectional elevational view of one embodiment of a thermoelectric heat pump for a cooling apparatus such as depicted, by way of example only, in FIG. 5 or FIG. 7, in accordance with one or more aspects of the present invention.

FIG. 8 is a cross-sectional elevational view of one embodiment of a thermoelectric-enhanced, fluid-to-fluid heat pump 720, in accordance with an aspect of the present invention. In this example, first heat exchange element 721 is, as one example, a first liquid-cooled cold plate, and second heat exchange element 722 is a second liquid-cooled cold plate, wherein coolant through first and second loop portions of the coolant loop ingresses and egresses through the respective cold plates. As shown, the heat pump comprises, by way of example, a thermoelectric array 800, which comprises (in this example) an array of thermoelectric modules 801, each of which may comprise individual thermoelectric elements 802.

The use of large thermoelectric cooling elements is known. These elements operate electronically to produce a cooling effect. By passing a direct current through the legs of a thermoelectric device, a heat flow is produced across the device which may be contrary to that which would be expected from Fourier's law.

At one junction of the thermoelectric element, both holes and electrons move away, towards the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (e.g., air or water). When direct current is passed through the thermoelectric modules, a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the thermoelectric module.

By way of specific example, thermoelectric modules 801 may comprise TEC CP-2-127-06L modules, offered by Melcor Laird, of Cleveland, Ohio.

Note that the thermoelectric array or heat pump may comprise any number of thermoelectric modules, including one or more modules, and is dependent (in part) on the size of the electronic modules, as well as the amount of heat to be transferred from coolant flowing through second heat exchange element 722, to coolant flowing through first heat exchange element 721. Also note that an insulative material (not shown) may be provided over one or more of the exposed surfaces of first heat exchange element 721 or second heat exchange element 722.

The thermoelectric (TE) array may comprise a planar thermoelectric array with modules arranged in a square or rectangular array. Although the wiring is not shown, each thermoelectric module in a column may be wired and supplied electric current (I) in series and the columns of thermoelectric modules may be electrically wired in parallel so that the total current supplied would be I×sqrt(M) for a square array comprising M thermoelectric modules, providing an appreciation of the inherent scalability of the array. In this way, if a single thermoelectric module should fail, only one column is effected, and electric current to the remaining columns may be increased to compensate for the failure.

Table 1 provides an example of the scalability provided by a planar thermoelectric heat exchanger configuration such as described herein.

TABLE 1

| Number of TE Modules (M) | Heat Exchanger Size |
|---|---|
| 81 | 585 mm × 585 mm (23.0 in. × 23.0 in.) |
| 100 | 650 mm × 650 mm (25.6 in. × 25.6 in.) |
| 121 | 715 mm × 715 mm (28.2 in. × 28.2 in.) |
| 144 | 780 mm × 780 mm (30.7 in. × 30.7 in.) |
| 169 | 845 mm × 845 mm (33.3 in. × 33.3 in.) |

For a fixed electric current and temperature difference across the thermoelectric modules, the heat pumped by the thermoelectric array will scale with the number of thermoelectric modules in the platform area. Thus, the heat load capability of a 650 mm×650 mm thermoelectric heat exchanger will be 1.23 times that of a 585 mm×585 mm thermoelectric heat exchanger, and that of an 845 mm×845 mm will be 2.09 times greater. Note that the size of the liquid-to-air heat exchanger may need to grow to accommodate the increased heat load. If the space available for the thermoelectric heat exchanger is constrained in the X×Y dimensions, then the heat pumping capabilities can still be scaled upwards by growing in the Z dimension. This can be done by utilizing multiple layers of thermoelectric modules between multiple heat exchange elements, with alternating hot and cold sides.

Returning to the implementation of FIG. 7, by way of example, the IT equipment in the electronics rack may be certified to the A2 ASHRAE specification of 35° C. air-inlet temperature, while the cooling air provided to the data center via, for instance, an air-side economizer may be at 40° C. to enhance energy efficiency of the data center. Advantageously, the thermoelectric heat pump(s) of the cooling apparatus disclosed provides the required additional 5° C. of cooling to the inlet air via, for instance, 32° C. liquid water as cooled coolant, with a coefficient of performance of 4.3. The thermoelectric heat pump may be cooled by the radiator heat exchanger using the 40° C. air passing across the radiator heat exchanger. In this example, the heated coolant leaving the air-to-liquid heat exchanger within the door assembly may rise to, for instance, 35.4° C., and be cooled by the combination of the heat rejection unit and the thermoelectric heat pump to, for instance, 32.3° C., before reentering the air-to-liquid heat exchanger within the door assembly, again using the 40° C. cooling air across the heat rejection unit.

Advantageously, the cooling apparatus depicted in FIG. 7 is appropriate for one or more selected electronics racks within a data center where certain other electronics equipment may be capable of, for instance, ASHRAE A3 specified cooling (40° C.), while only one or more selected electronics racks of the data center require the additional cooling assist provided by the cooling apparatus described. Further, note that the cooling apparatus of FIG. 7 requires no connection to a facility coolant system, thus avoiding the need for an expensive refrigeration system or chiller plant. Further, note that the electric power required by the thermoelectric heat pump may be supplied from the bulk power assembly within the electronics rack itself. This electric power may be modulated in a non-linear fashion to provide the required cooling at the air-to-liquid heat exchanger located at the air-inlet side of the electronics rack.

Note that numerous implementation variations on the cooling apparatus depicted in FIG. 7 are possible. For instance, in another embodiment, the radiator heat exchanger and associated radiator fan could be replaced by a liquid-to-liquid heat exchanger to cool, in part, the thermoelectric heat pump. This heat exchanger might receive liquid from an evaporative cooling system or refrigeration chiller, for example. In another embodiment, the radiator heat exchanger and/or the thermoelectric heat pump, could be removed from the electronics rack and, for instance, placed remotely from the rack within the data center.

By way of example, note in FIG. 5 the addition of a thermoelectric heat pump 720, for instance, within the underfloor plenum of the data center between first and second portions of the coolant loop facilitating coolant flow through one of the air-inlet side heat exchangers. Thus, in this implementation, only selected ones of the electronics racks 110 are identified for additional thermoelectric-enhanced cooling of the liquid coolant into the air-to-liquid heat exchanger associated with door assembly 330 at the air-inlet side of the electronics rack. Note that this implementation of the cooling apparatus is similar to that of FIG. 7, except that the heat rejection unit and the thermoelectric heat pump are both disposed external to and separate from the selected electronics rack requiring the additional cooling to the airflow ingressing into the rack.

Figure 9:
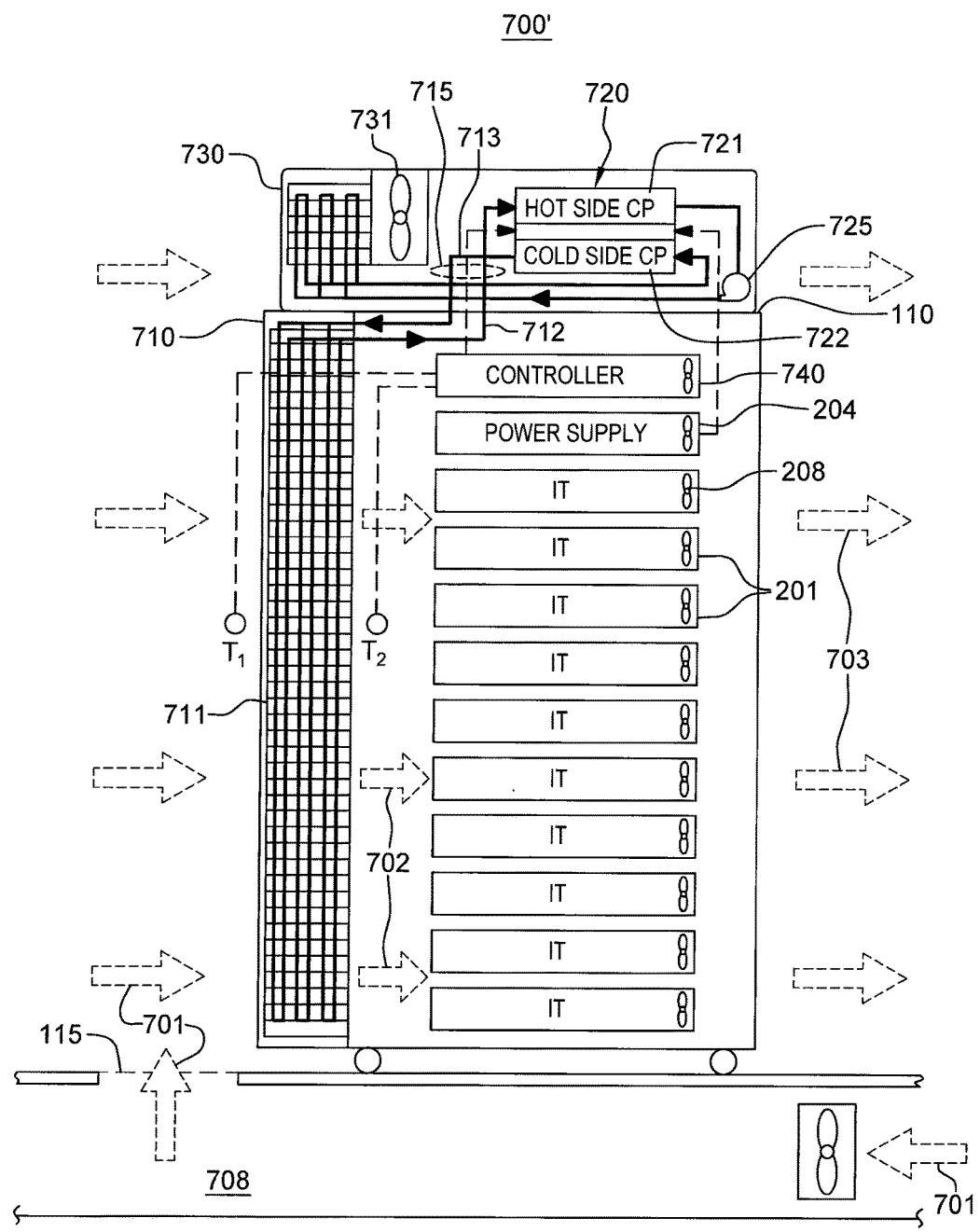
FIG. 9 is a schematic of another embodiment of an electronics rack and associated rack-level cooling apparatus, in accordance with one or more aspects of the present invention.

FIG. 9 depicts a further example of a data center 700', where the thermoelectric heat pump 720 and heat rejection unit 730 are disposed external to electronics rack 110, and in particular, in this example, above the electronics rack. Note that in this configuration, additional space is made available within the electronics rack for additional IT systems, and the air-to-liquid heat exchanger(s) 711 within door assembly 710 may extend, for instance, the full height of electronics rack 110.

Figure 10:
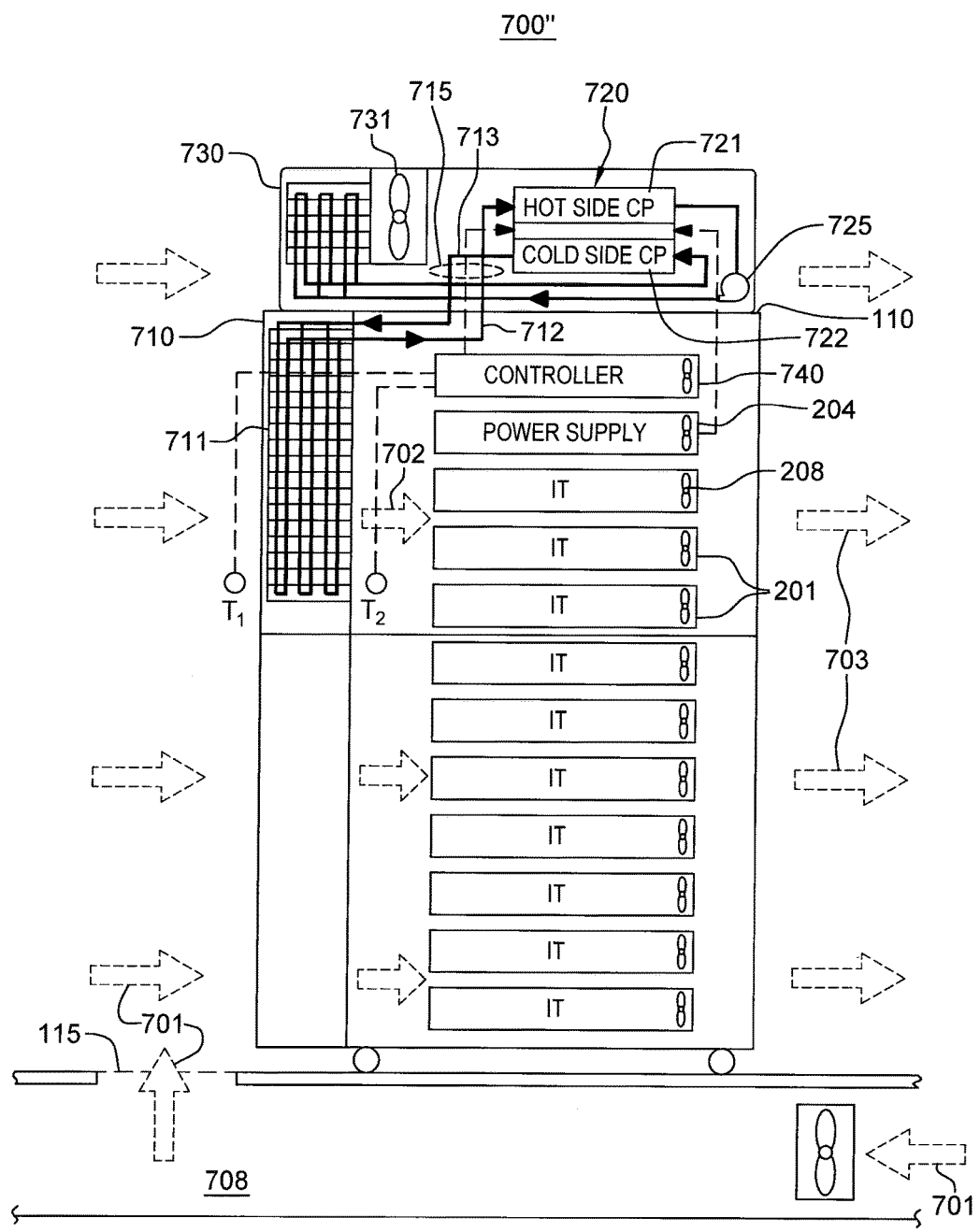
FIG. 10 is a schematic of a further embodiment of an electronics rack and associated cooling apparatus facilitating cooling of a portion of the airflow ingressing into the electronics rack at the air-inlet side thereof, in accordance with one or more aspects of the present invention.

FIG. 10 depicts a further data center 700" variation using the cooling apparatus and electronics rack of FIGS. 7-9, wherein the air-to-liquid heat exchanger 711 is sized to further reduce temperature of airflow into the air-inlet side of the electronics rack only in an upper portion of the electronics rack where, for instance, IT systems with lower-temperature-rated cooling requirements may reside (in one example).

Disclosed herein are various embodiments of a thermoelectric-assisted, air-inlet side cooling apparatus. The cooling apparatus includes an air-to-liquid heat exchanger associated with an electronics rack and disposed at the air-inlet side of the electronics rack. A coolant loop facilitates coolant flow through the air-to-liquid heat exchanger, and includes a first loop portion and a second loop portion, where the heat exchanger exhausts heated coolant to the first loop portion and receives cooled coolant from the second loop portion. A heat rejection unit and one or more thermoelectric heat pumps are also provided, for instance, within the electronics rack or a door assembly disposed at the air-inlet side of the electronics rack. Alternatively, the heat rejection unit and/or the one or more thermoelectric heat pumps may be disposed external to the electronics rack and door assembly, such as remotely within the data center housing the electronics rack.

The heat rejection unit is coupled to the coolant loop between the first loop portion and the second loop portion, and rejects heat from the heated coolant passing through the first loop portion to provide partially-cooled coolant to the second loop portion. The thermoelectric heat pump(s) is disposed with the first loop portion of the coolant loop coupled to a first side of the heat pump, and the second loop portion of the coolant loop coupled to a second side of the heat pump. In one or more implementations, first and second coolant cold plates may be associated with the first and second coolant loops to facilitate coupling of the coolant loops to the first and second sides of the thermoelectric heat pump(s). The thermoelectric heat pump(s) or module(s) transfers heat from partially-cooled coolant within the second loop portion to heated coolant within the first loop portion to provide a cooled coolant for the air-to-liquid heat exchanger, as discussed above. Numerous enhancements to the cooling apparatus are described herein, and claimed below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A cooling apparatus comprising:
    an air-to-liquid heat exchanger associated with an electronics rack and disposed at an air-inlet side of the electronics rack, wherein an airflow enters the electronics rack at the air-inlet side and egresses from the electronics rack at an air-outlet side, the air-to-liquid heat exchanger cooling, at least in part, the airflow entering into the electronics rack;
    a coolant loop facilitating coolant flow through the air-to-liquid heat exchanger, the coolant loop comprising a first loop portion and a second loop portion, the air-to-liquid heat exchanger exhausting heated coolant to the first loop portion and receiving cooled coolant from the second loop portion;
    a heat rejection unit coupled to the coolant loop between the first loop portion and the second loop portion, the heat rejection unit rejecting heat from the heated coolant passing through the first loop portion to provide partially-cooled coolant to the second loop portion; and
    at least one thermoelectric heat pump disposed with the first loop portion of the coolant loop coupled to a first side of the at least one thermoelectric heat pump, and the second loop portion of the coolant loop coupled to a second side of the at least one thermoelectric heat pump, wherein the at least one thermoelectric heat pump transfers heat from the partially-cooled coolant within the second loop portion to the heated coolant within the first loop portion to provide the cooled coolant for the air-to-liquid heat exchanger.

2. The cooling apparatus of claim 1, further comprising a door assembly coupled to the electronics rack at the air-inlet side of the electronics rack, the door assembly facilitating the cooling, at least in part, of the airflow into the electronics rack, and thereby, cooling of one or more electronic components within the electronics rack, the door assembly comprising:
    a door frame with an airflow opening facilitating passage of the airflow through the door assembly and into the electronics rack;
    wherein the air-to-liquid heat exchanger is disposed within the door assembly so that, at least in part, the airflow through the airflow opening passes across the air-to-liquid heat exchanger, the air-to-liquid heat exchanger extracting heat from the airflow passing thereacross.

3. The cooling apparatus of claim 2, wherein the at least one thermoelectric heat pump and the heat rejection unit are each disposed within at least one of the electronics rack or the door assembly, and the cooling apparatus further comprises a coolant pump in fluid communication with the coolant loop to circulate the coolant through the coolant loop, the air-to-liquid heat exchanger, and the heat rejection unit.

4. The cooling apparatus of claim 2, wherein the heat rejection unit comprises a radiator heat exchanger rejecting heat from the heated coolant passing through the radiator heat exchanger to air passing across the radiator heat exchanger, the radiator heat exchanger being located within the door assembly.

5. The cooling apparatus of claim 4, further comprising an air-moving device facilitating the air passing across the radiator heat exchanger, the air-moving device being disposed within the electronics rack.

6. The cooling apparatus of claim 1, wherein the heat rejection unit comprises:
an air-cooled cooling station comprising:
a coolant-to-air heat exchanger; and
ducting for directing a cooling airflow across the coolant-to-air heat exchanger.

7. The cooling apparatus of claim 6, wherein the air-cooled station comprises a separate, external structure from the electronics rack, and wherein the cooling airflow comprises outdoor air drawn into the air-cooled cooling station.

8. The cooling apparatus of claim 1, wherein the first loop portion of the coolant loop comprises a first heat exchange element and the second loop portion of the coolant loop comprises a second heat exchange element, and wherein the heated coolant in the first loop portion passes through the first heat exchange element, and the partially-cooled coolant in the second loop portion passes through the second heat exchange element, the first heat exchange element being coupled to the first side of the at least one thermoelectric heat pump, and the second heat exchange element being coupled to the second side of the at least one thermoelectric heat pump, the first heat exchange element and the second heat exchange element facilitating transfer of heat across the at least one thermoelectric heat pump from the partially-cooled coolant passing through the second heat exchange element to the heated coolant passing through the first heat exchange element.

9. The cooling apparatus of claim 1, wherein the cooling apparatus is associated with only the electronics rack, and provides self-contained, rack-level cooling of the airflow entering the electronics rack.

10. The cooling apparatus of claim 1, wherein the coolant loop couples the air-to-liquid heat exchanger, the first loop portion, the heat rejection unit, and the second loop portion in series-fluid communication, the first loop portion being coupled between an outlet of the air-to-liquid heat exchanger and an inlet of the heat rejection unit, and the second loop portion being coupled between an outlet of the heat rejection unit and an inlet of the air-to-liquid heat exchanger.

11. A data center comprising:
multiple electronics racks; and
a cooling apparatus for cooling an electronics rack of the multiple electronics racks, the cooling apparatus comprising:
an air-to-liquid heat exchanger associated with the electronics rack and disposed at an air-inlet side of the electronics rack, wherein an airflow enters the electronics rack at the air-inlet side and egresses from the electronics rack at an air-outlet side, the air-to-liquid heat exchanger cooling, at least in part, the airflow entering into the electronics racks;
a coolant loop facilitating coolant flow through the air-to-liquid heat exchanger, the coolant loop comprising a first loop portion and a second loop portion, the air-to-liquid heat exchanger exhausting heated coolant to the first loop portion and receiving cooled coolant from the second loop portion;
a heat rejection unit coupled to the coolant loop between the first loop portion and the second loop portion, the heat rejection unit rejecting heat from the heated coolant passing through the first loop portion to provide partially-cooled coolant to the second loop portion; and
at least one thermoelectric heat pump disposed with the first loop portion of the coolant loop coupled to a first side of the at least one thermoelectric heat pump, and the second loop portion of the coolant loop coupled to a second side of the at least one thermoelectric heat pump, wherein the at least one thermoelectric heat pump transfers heat from the partially-cooled coolant within the second loop portion to the heated coolant within the first loop portion to provide the cooled coolant for the air-to-liquid heat exchanger.

12. The data center of claim 11, further comprising a door assembly coupled to the electronics rack at the air-inlet side of the electronics rack, the door assembly facilitating the cooling, at least in part, of the airflow into the electronics rack, and thereby, cooling of one or more electronic components within the electronics rack, the door assembly comprising:
a door frame with an airflow opening facilitating passage of the airflow through the door assembly and into the electronics rack;
wherein the air-to-liquid heat exchanger is disposed within the door assembly so that, at least in part, the airflow through the airflow opening passes across the air-to-liquid heat exchanger, the air-to-liquid heat exchanger extracting heat from the airflow passing thereacross.

13. The data center of claim 12, wherein the at least one thermoelectric heat pump and the heat rejection unit are each disposed within at least one of the electronics rack or the door assembly, and the cooling apparatus further comprises a coolant pump in fluid communication with the coolant loop to circulate the coolant through the coolant loop, the air-to-liquid heat exchanger, and the heat rejection unit.

14. The data center of claim 12, wherein the heat rejection unit comprises a radiator heat exchanger rejecting heat from the heated coolant passing through the radiator heat exchanger to air passing across the radiator heat exchanger, the radiator heat exchanger also being disposed within the door assembly.

15. The data center of claim 14, further comprising an air-moving device facilitating the air passing across the radiator heat exchanger, the air-moving device being disposed within the electronics rack.

16. The data center of claim 11, wherein the heat rejection unit comprises:
an air-cooled cooling station comprising:
a coolant-to-air heat exchanger; and
ducting for directing a cooling airflow across the coolant-to-air heat exchanger.

17. The data center of claim 16, wherein the air-cooled station comprises a separate, external structure from the electronics rack, and wherein the cooling airflow comprises outdoor air drawn into the air-cooled cooling station.

* * * * *